United States Patent
Frisina et al.

(10) Patent No.: US 10,153,207 B2
(45) Date of Patent: Dec. 11, 2018

(54) METHOD FOR MANUFACTURING A SILICON CARBIDE WAFER USING A SUSCEPTOR HAVING DRAINING OPENINGS

(71) Applicant: STMicroelectronics S.R.L., Agrate Brianza (IT)

(72) Inventors: Ferruccio Frisina, S. Agata Li Battiati (IT); Giuseppe Abbondanza, San Giovanni la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 167 days.

(21) Appl. No.: 15/194,309

(22) Filed: Jun. 27, 2016

(65) Prior Publication Data

US 2016/0307800 A1    Oct. 20, 2016

Related U.S. Application Data

(62) Division of application No. 13/714,277, filed on Dec. 13, 2012, now Pat. No. 9,406,504.

(30) Foreign Application Priority Data

Dec. 15, 2011 (IT) .................. MI2011A2273

(51) Int. Cl.
*C30B 25/10* (2006.01)
*H01L 21/78* (2006.01)
(Continued)

(52) U.S. Cl.
CPC .......... *H01L 21/7806* (2013.01); *C23C 16/01* (2013.01); *C23C 16/0218* (2013.01);
(Continued)

(58) Field of Classification Search
CPC ........... C30B 9/06; C30B 19/04; C30B 19/08; C30B 19/12; C30B 25/00; C30B 25/02;
(Continued)

(56) References Cited

U.S. PATENT DOCUMENTS 3,777,009 A    12/1973  Menashi et al.
4,537,651 A *   8/1985  Shuskus ............... C30B 33/00
                                                    117/88
(Continued)

*Primary Examiner* — Kenneth A Bratland, Jr.
(74) *Attorney, Agent, or Firm* — Seed IP Law Group LLP

(57) ABSTRACT

An embodiment described herein includes a method for producing a wafer of a first semiconductor material. Said first semiconductor material has a first melting temperature. The method comprises providing a crystalline substrate of a second semiconductor material having a second melting temperature lower than the first melting temperature, and exposing the crystalline substrate to a flow of first material precursors for forming a first layer of the first material on the substrate. The method further comprising bringing the crystalline substrate to a first process temperature higher than the second melting temperature, and at the same time lower than the first melting temperature, in such a way the second material melts, separating the second melted material from the first layer, and exposing the first layer to the flow of the first material precursor for forming a second layer of the first material on the first layer.

17 Claims, 10 Drawing Sheets

(51) Int. Cl.

| | |
|---|---|
| *C30B 33/00* | (2006.01) |
| *C30B 33/06* | (2006.01) |
| *H01L 21/02* | (2006.01) |
| *C30B 9/06* | (2006.01) |
| *C30B 19/04* | (2006.01) |
| *C30B 19/08* | (2006.01) |
| *C30B 19/12* | (2006.01) |
| *C30B 29/36* | (2006.01) |
| *C23C 16/01* | (2006.01) |
| *C23C 16/02* | (2006.01) |
| *C23C 16/32* | (2006.01) |
| *C23C 16/458* | (2006.01) |

(52) U.S. Cl.
CPC ........ *C23C 16/325* (2013.01); *C23C 16/4583* (2013.01); *C30B 9/06* (2013.01); *C30B 19/04* (2013.01); *C30B 19/08* (2013.01); *C30B 19/12* (2013.01); *C30B 29/36* (2013.01); *C30B 33/00* (2013.01); *C30B 33/06* (2013.01); *H01L 21/02381* (2013.01); *H01L 21/02529* (2013.01); *H01L 21/02609* (2013.01)

(58) Field of Classification Search
CPC ......... C30B 25/10; C30B 25/12; C30B 29/00; C30B 29/10; C30B 29/36; C30B 33/00; C30B 33/06; C30B 35/00; C30B 35/002; C23C 16/00; C23C 16/01; C23C 16/0218; C23C 16/30; C23C 16/32; C23C 16/325; C23C 16/4418; C23C 16/458; C23C 16/4582; C23C 16/4583; C23C 16/4586; H01L 21/02381; H01L 21/02529; H01L 21/02609; H01L 21/7806
USPC .......... 117/84, 88–90, 94, 97, 105–106, 200, 117/204, 911, 915, 937, 951
See application file for complete search history.

(56) References Cited

U.S. PATENT DOCUMENTS

| | | | |
|---|---|---|---|
| 4,574,730 | A | 3/1986 | Svilans |
| 4,582,561 | A | 4/1986 | Ioku et al. |
| 5,183,529 | A * | 2/1993 | Potter .................... C23C 16/01 |
| | | | 264/81 |
| 5,277,933 | A | 1/1994 | Claar et al. |
| 2002/0072249 | A1* | 6/2002 | Nagasawa ............... C30B 25/00 |
| | | | 438/778 |
| 2006/0233670 | A1 | 10/2006 | Lehto |
| 2007/0266931 | A1 | 11/2007 | Mueller et al. |
| 2009/0175777 | A1* | 7/2009 | Scarsbrook .......... C30B 25/105 |
| | | | 423/446 |
| 2016/0348222 | A1 | 12/2016 | Isaac |

* cited by examiner

METHOD FOR MANUFACTURING A SILICON CARBIDE WAFER USING A SUSCEPTOR HAVING DRAINING OPENINGS

BACKGROUND OF THE DISCLOSURE

1. Technical Field

The present disclosure relates to the electronics sector. More in detail, the present disclosure relates to a method for manufacturing a semiconductor material wafer.

2. Description of the Related Art

A semiconductor electronic device, either an Integrated Circuit (IC) or a power device, is a circuit whose components are directly fabricated in a semiconductor material substrate. The substrates of the great majority of the ICs presently available on the market are obtained from silicon (Si) wafers.

Recently, silicon carbide (SiC) wafers have been developed. Compared to silicon, silicon carbide has different chemical-physical properties, at least in part due to the different band gap value (indeed, silicon carbide has a band gap higher than that of silicon). For example, silicon carbide has a breaking voltage higher than that of the silicon, and it is thus an optimal material for manufacturing electronic devices for power applications, since a wafer (and, thus, a substrate for an IC) formed in silicon carbide is capable of managing voltages of relatively high values even with a relatively thin thickness. Moreover, using a silicon carbide wafer is particularly advantageous in all the electronic fields requiring the managing of high frequency signals.

Silicon wafers are typically formed in pure monocrystalline silicon. A known manufacturing process for generating wafers of this type is the so-called "Czochralski growth process", which provides for introducing a monocrystalline silicon seed within a mass of melted silicon, and the gradual extraction of the seed from the melted silicon together with a slow rotation of the seed itself.

The presently employed techniques for growing a silicon carbide crystal are very complex and expensive. Because of its peculiar physical features, a silicon carbide wafer cannot be manufactured with the methods used for manufacturing silicon wafers. Since silicon carbide is a material which directly passes (sublimates) from the solid phase to the vapour phase, without passing from any liquid phase, the Czochralski growth process cannot be used, since this latter process just requires that the seed is inserted in a melting of the desired material.

Silicon carbide may occur in a number of different chrystallographic structures (polytypes). Among the number of polytypes, the most common are the cubic polytype (3C polytype), the hexagonal polytype (4H and 6H polytypes), and the rhombohedric polytype (15R polytype). Presently, by complex and expensive processes it is possible to manufacture silicon carbide wafers of the 4H and 6H polytypes having diameters not higher than four inches starting from the corresponding crystal obtained by a sublimation process. Such processes provides for cutting the ingot in slices, lapping, polishing of one of the two faces and then epitaxial growth.

BRIEF SUMMARY

Being not possible to use the Czochralski growth process for manufacturing silicon carbide wafer, a possible solution for the 3C polytype (briefly, 3C SiC), may provide for using epitaxial growth techniques. As it is known to the skilled technicians, with epitaxial growth it is intended a method which provides for the deposition of thin layers of material on a crystalline substrate, which addresses its growing and determinates its structural properties. However, with the presently available technologies it is very difficult obtaining a 3C SiC crystal to be used as a crystalline substrate for a subsequent epitaxial growth. In order to solve this problem, some known solutions provide for the growing of a 3C SiC layer by a heteroepitaxial process starting from a silicon substrate. However, such known solutions only allow the growing of layers having very thin thickness (lower than a micron) or scarce quality (high defectiveness).

This above mentioned drawbacks do not affect the 3C SiC case only, but also other materials for which it is difficult to grow a crystal to be used as substrate for a subsequent epitaxial growth, such as for example the Gallium Nitride (GaN).

Today, the presently available solutions do not allow to produce wafers of 3C polytype silicon carbide (and of equivalent materials) having a sufficiently high quality for the implementation of devices.

According to an embodiment of the present disclosure, a possible solution of the drawbacks which affects the presently used growing processes, provides for the deposition of a first layer of the desired material on a crystalline substrate having a lower melting temperature, the subsequent elimination of the substrate by the melting, and the deposition of a second layer of the desired material on the first layer.

A first aspect according to an embodiment of the present disclosure relates to a method for producing a wafer of a first semiconductor material. Said first semiconductor material has a first melting temperature. The method comprises providing a crystalline substrate of a second semiconductor material having a second melting temperature lower than the first melting temperature, and exposing the crystalline substrate to a flow of first material precursors for forming a first layer of the first material on the substrate. The method further comprising bringing the crystalline substrate to a first process temperature higher than the second melting temperature, and at the same time lower than the first melting temperature, in such a way the second material melts, separating the second melted material from the first layer, and exposing the first layer to the flow of the first material precursor for forming a second layer of the first material on the first layer.

In this way it is possible to obtain material wafers with a single process, eliminating some of the process phases of the known solutions presently in use (among which cutting of the crystal in slices, lapping and polishing).

Another aspect according to an embodiment of the present disclosure relates to a reaction chamber for producing a semiconductor material wafer. Such reaction chamber comprises a susceptor, heating means for heating the susceptor, and conduction means for providing a precursors flow. Said susceptor comprises a plurality of draining openings adapted to make melted material generated during the manufacturing of the semiconductor material wafer flowing out from the susceptor.

A further aspect of the present disclosure relates to a semiconductor material wafer.

DETAILED DESCRIPTION

The present detailed description refers to a method for manufacturing a 3C SiC wafer by means of a Chemical Vapor Deposition (CVD) hetero-homo epitaxial growing process starting from a silicon substrate, and to a corresponding reaction chamber wherein carrying out such method.

Figure 1:
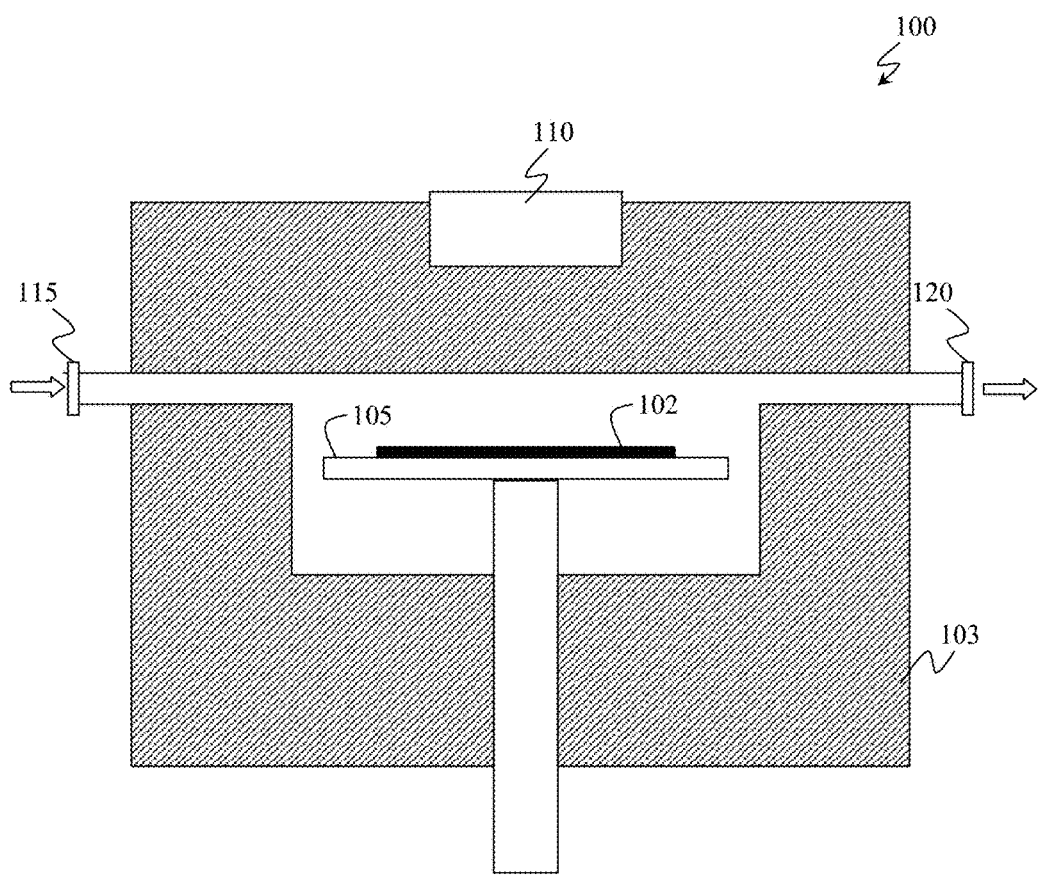
FIG. 1 schematically illustrates in a sectional view, a horizontal reaction chamber according to a known solution.

FIG. 1 schematically illustrates by means of a sectional view a reaction chamber 100 wherein the concepts of the present disclosure may be applied.

Without descending into specific details which are outside the purpose of the present document, the reaction chamber 100 comprises a hollow body 103 formed in an insulating material, adapted to thermally insulate the inner cavity from the external environment. The reaction chamber 100 comprises a support 105 (also referred to as a "susceptor") adapted to sustain the crystalline substrate 102 on which a 3C SiC layer is epitaxially grown, as will be described in detail in the following of the present description. The susceptor 105 is a substantially flat element, for example having a circular shape, implemented in a material having a high melting temperature, such as for example naked graphite having a high degree of pureness and a high dilatation coefficient. The reaction chamber comprises a heating device 110 configured to heat the susceptor 105. For example, the heating device 110 may be of the inductive type, comprising coils, or of the resistive type, comprising carbide covered resistors.

As it is known to those skilled in the art, the deposition process provides that the substrate 102, supported and heated by the susceptor 105, is invested by a gas flow that carries—in gaseous form—the particles of the material to be deposited on the substrate 102 itself; that is, the gas flow comprising particles of a material to be deposed is identified as "precursor" of the material itself. An input duct 115 is provided for inputting the precursors within the reaction chamber 100, and an output duct 120 is provided for discharging the reaction gases outside the reaction chamber 100.

In the reaction chamber 100 illustrated in FIG. 1, the input duct 115 and the output duct 120 are arranged in such a way that the precursor flow hits the substrate 102 longitudinally to the main surface of the substrate 102 itself. A reaction chamber of this type is referred to as horizontal flux reaction chamber.

Figure 2:
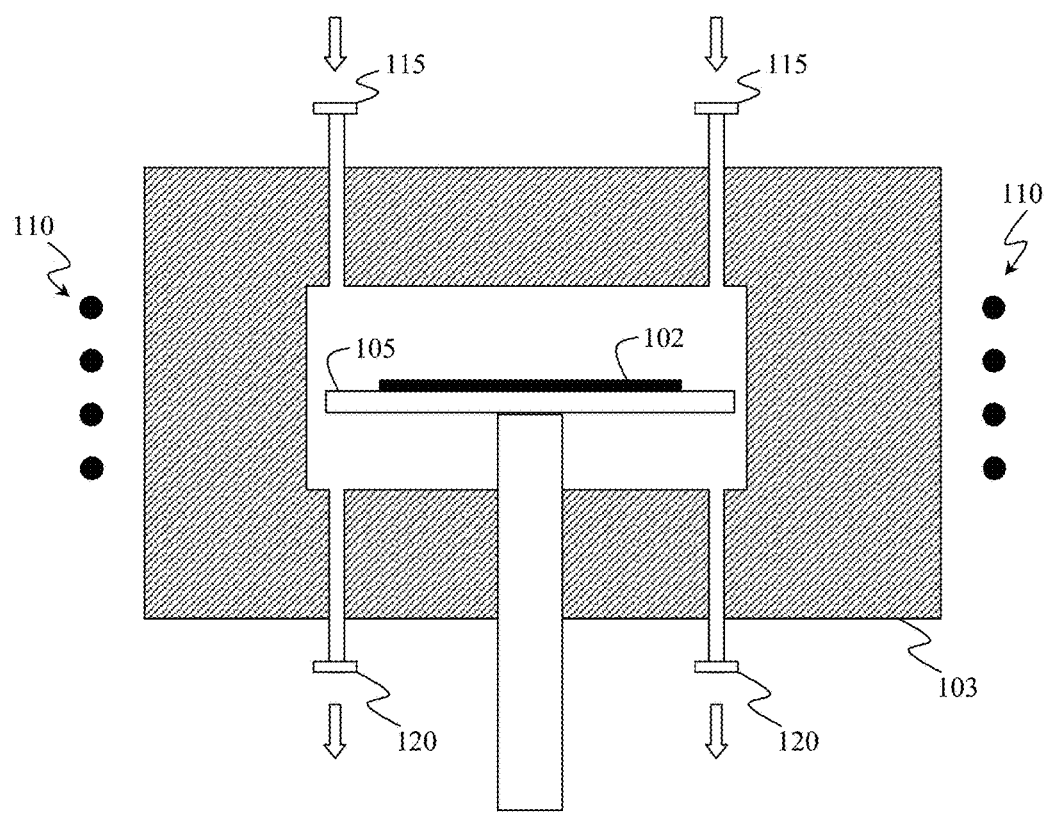
FIG. 2 schematically illustrates in a sectional view, a vertical reaction chamber according to a known solution.

The concepts of the present disclosure may be however applied to vertical flux reaction chambers, wherein the input duct and the output duct are arranged in such a way that the precursor flow hits the substrate transversally to the main surface of the substrate itself, and wherein the heating element is of the induction type. A possible example of a reaction chamber of this type is illustrated in FIG. 2.

As will be described in detail in the following of the present disclosure, the method according to an embodiment of the present disclosure provides that from the wafer in process melted material is generated, which melted material requires to be drained and collected, for being removed in a second time. For this reason, according to an embodiment of the present disclosure, the susceptor is provided with draining openings for the flowing out of the melted material.

Figure 3A:
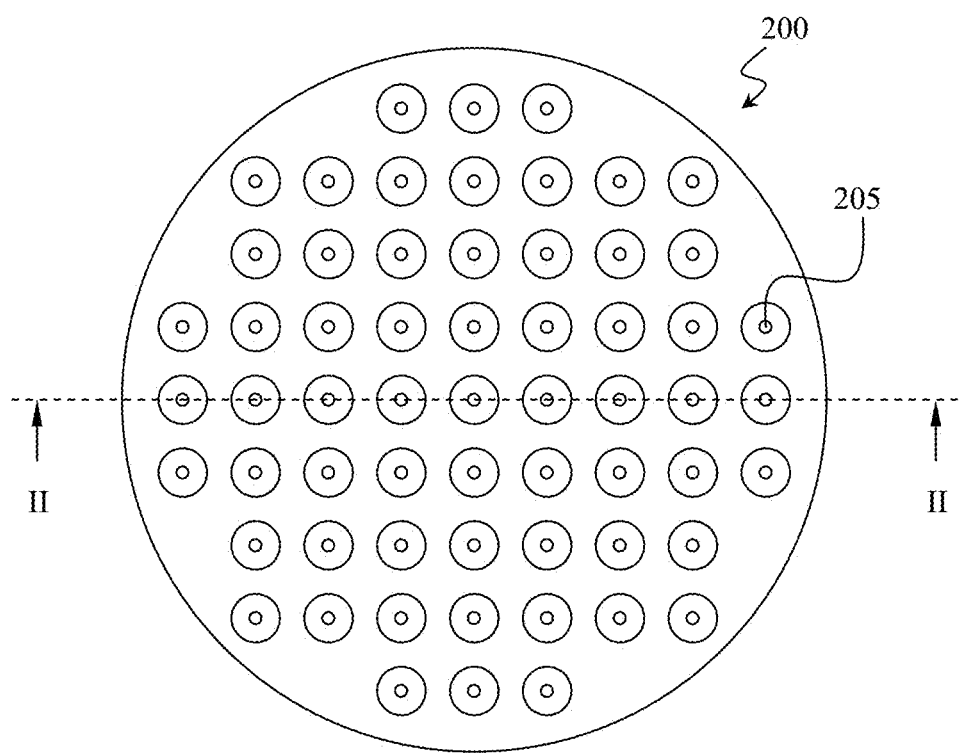
FIG. 3A is a view from above a susceptor adapted to be employed in the reaction chamber of FIG. 1 according to an embodiment of the present disclosure.
Figure 3B:
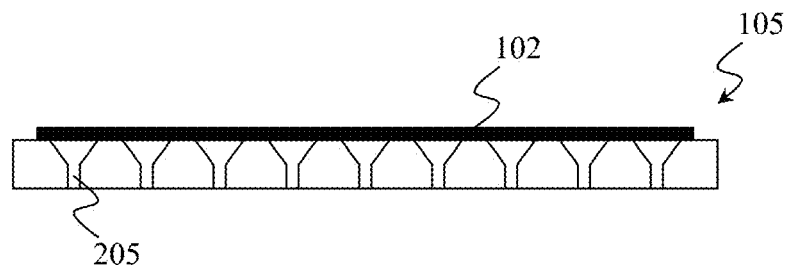
FIG. 3B is a sectional view of the susceptor of FIG. 3A taken along a sectional plan perpendicular to the surface of the susceptor.

FIG. 3A is a view from above a susceptor 200 according to an embodiment of the present disclosure; FIG. 3B is a sectional view of the susceptor 200 of FIG. 3A taken along a sectional plane perpendicular to the surface of the susceptor 200 and passing from the line II-II. According to such embodiment, the susceptor 200 comprises a plurality of circular draining openings, identified in FIGS. 3A and 3B with the reference 205, uniformly arranged along the susceptor surface 205. As visible in FIG. 3B, in the considered embodiment the draining openings are shaped according to a "funnel" shape, with a beginning cone-shaped portion and a terminating cylindrical portion.

Figure 4A:
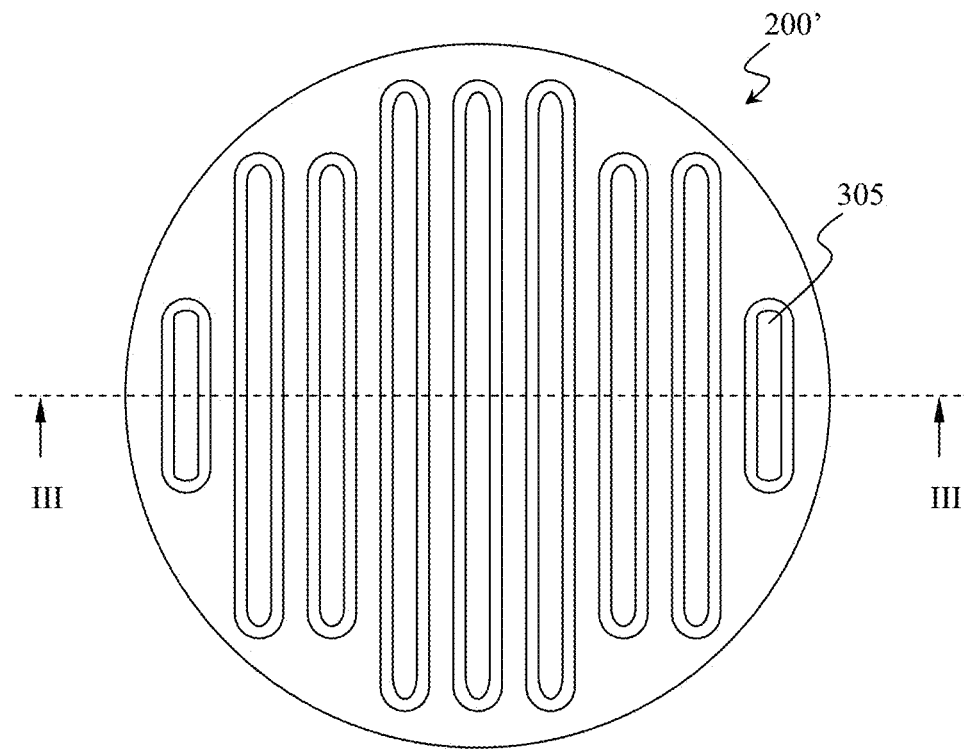
FIG. 4A is a view from above a susceptor adapted to be employed in the reaction chamber of FIG. 1 according to a further embodiment of the present disclosure.
Figure 4B:
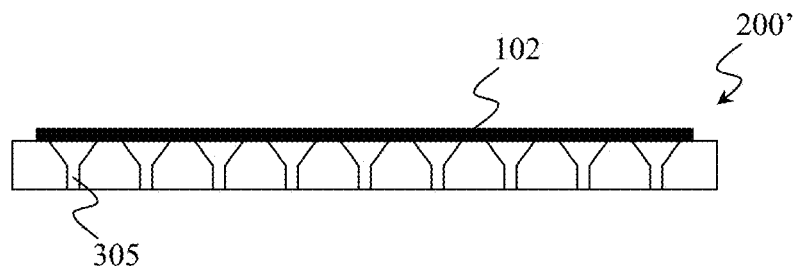
FIG. 4B is a sectional view of the susceptor of claim 4A taken along a sectional plan perpendicular to the surface of the susceptor.

FIG. 4A is a view from above another susceptor 200' according to a further embodiment of the present disclosure; FIG. 4B is a sectional view of the susceptor 200' of FIG. 4A taken along a sectional plane perpendicular to the surface of the susceptor 200' and passing from the line III-III. According to such embodiment, the susceptor 200' comprises a plurality of draining openings substantially having a slit shape, identified in FIGS. 4A and 4B with the reference 305, in such a way to define a substantially grid structure on the surface of the susceptor.

Naturally, the susceptors 200, 200' illustrated in FIGS. 3A, 3B, 4A and 4B are to be considered only for exemplificative and non (imitative purposes, since the concepts of the present disclosure may be applied to susceptors having draining openings having different shapes and arrangements (e.g., having a polygonal shape).

Figure 5:
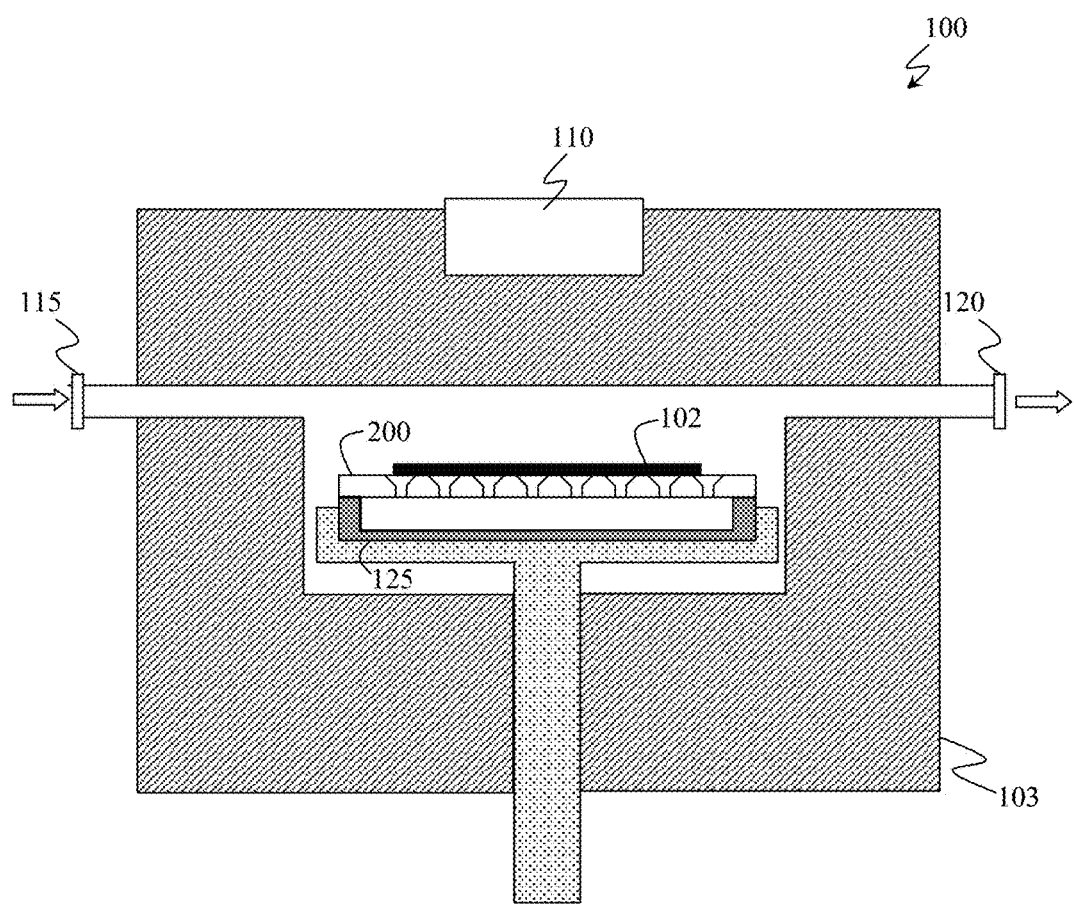
FIG. 5 is a sectional view of a reaction chamber according to an embodiment of the present disclosure.

Making reference to FIG. 5, a susceptor according to the present disclosure—i.e., provided with draining openings—is located within the reaction chamber 100 on a support comprising a gathering tank 125 (for example, in graphite). In the illustrated example, the employed susceptor is the susceptor 200 of FIGS. 3A and 3B, provided with circular openings. However, it is underlined that same considerations apply to susceptors provided with draining openings having a different shape, such as the slit draining openings of the susceptor 200' of FIGS. 4A and 4B.

A method for manufacturing a 3C SiC wafer which exploits the reaction chamber 100 (indifferently, at horizontal or vertical flow) equipped with the susceptor 200 provided with draining openings according to an embodiment of the present disclosure.

Figure 6:
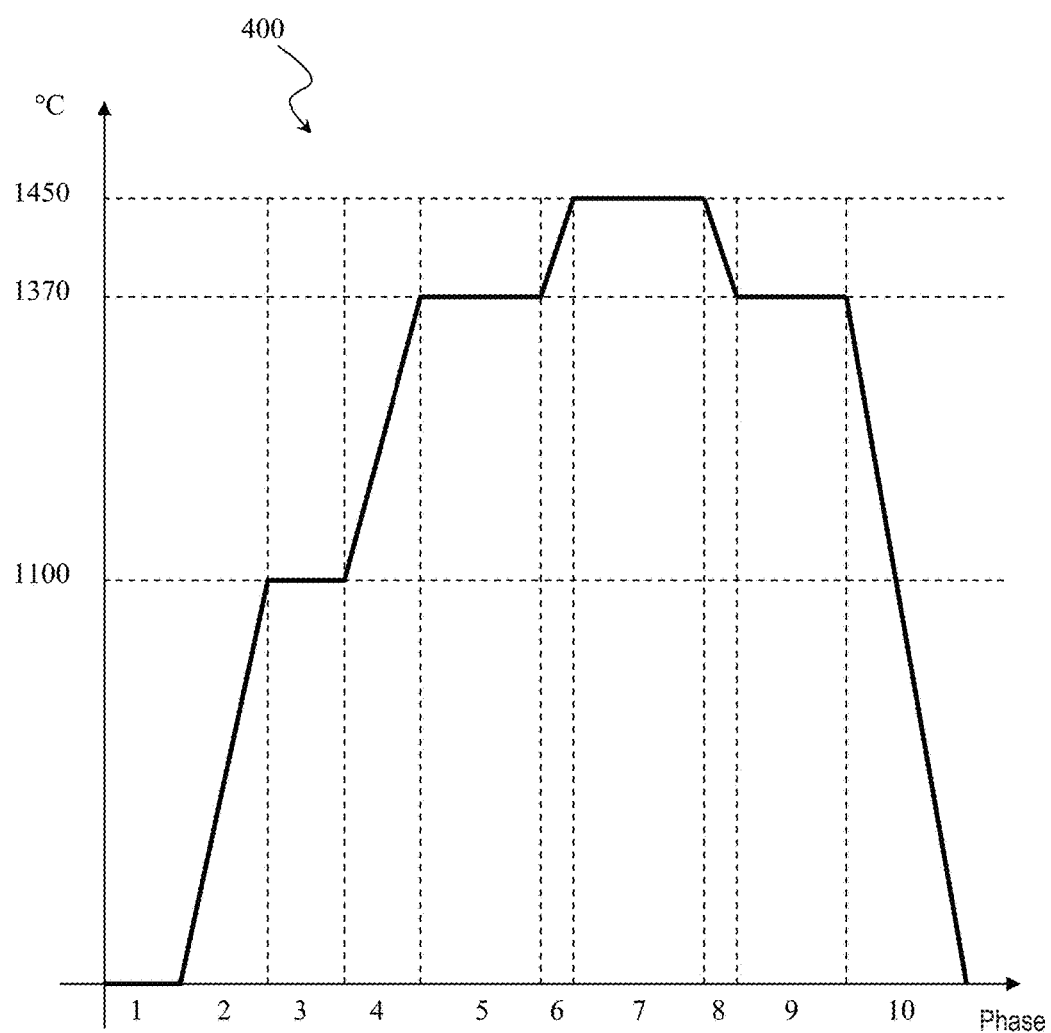
FIG. 6 illustrates a possible thermal profile of the reaction chamber of FIG. 5 during phases of a method for producing a semiconductor material wafer according to an embodiment of the present disclosure.

During the manufacturing of the 3C SiC wafer, the temperature of the reaction chamber 100—and in particular of the susceptor 200—is varied by properly driving the heating devices 110; to this end, FIG. 6 illustrates a possible thermal profile 400 of the reaction chamber 100 during the various phases of the method according to an embodiment of the present disclosure.

Figure 7A:
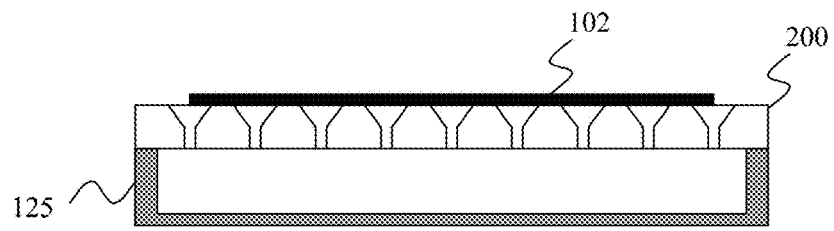
FIGS. 7A-7D are sectional view of a semiconductor material wafer during some steps of the realization method according to an embodiment of the present disclosure.

PHASE 1: The reaction chamber 100 is at the room temperature. A silicon crystalline substrate 102, for example of the (100) type, is positioned on the susceptor 200, A situation of this type is shown in FIG. 7A.

PHASE 2: The heating devices 110 are activated for rising the temperature of the reaction chamber 100 until reaching a temperature equal to about 1000-1100° C. The ducts 115 and 120 are opened for immersing the substrate 102 in a hydrogen flow.

PHASE 3: The temperature is kept at the same value reached in the previous phase. The surface of the substrate 102 is subjected to activation operations, for example by $H_2$, HCl and deposition of silicon buffer.

PHASE 4: The temperature of the reaction chamber 100 is risen until about 1330-1380° C. A carbon precursor is added to the hydrogen flow, in order to carbonise the superficial silicon atoms of the substrate 102, and obtaining a thin layer, of the order of few nanometers, of SiC (in jargon, "ramp carbonisation"). Such thin layer of silicon carbide has the purpose of acting as a seed for the SiC growth which will be carried out in the following phase.

Figure 7B:
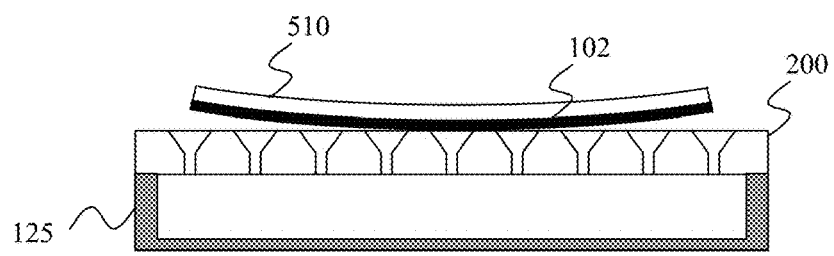

PHASE 5: Keeping the temperature of the reaction chamber 100 at about 1330-1380° C., a silicon precursor is added to the carbon precursor. In this way, a 3C SiC layer is caused to grow from the thin layer previously generated (epitaxial grow). Since the silicon of the substrate has a reticule that is different than the silicon carbide of the growing layer (5.43 angstroms for the silicon and 4.36 angstroms for the silicon carbide), the more the 3C SiC layer grows, the more the semiconductor wafer tends to warp. Although a semiconductor material wafer having an excessive warping cannot be used for integrating electronic devices, since the integration operations request the use of sufficiently planar wafers, this phase is however made to last a time sufficient to grow a 3C SiC layer having a thickness of some tents of microns (for example, 30-40 microns), causing a non negligible warping. A situation of this type is illustrated in FIG. 7B, wherein the 3C SiC layer is identified with the reference 510. The drawback of the excessive wafer warping is resolved according to one embodiment of the present disclosure in the following phases of the method which will be now described.

PHASE 6: According to an embodiment of the present disclosure, the temperature of the reaction chamber 100 is risen until reaching a temperature higher than the melting temperature of the silicon, and at the same time lower than the melting temperature of the 3C SiC. For example, the reaction chamber 100 is brought to a temperature of about 1450-1460° C.

Figure 7C:
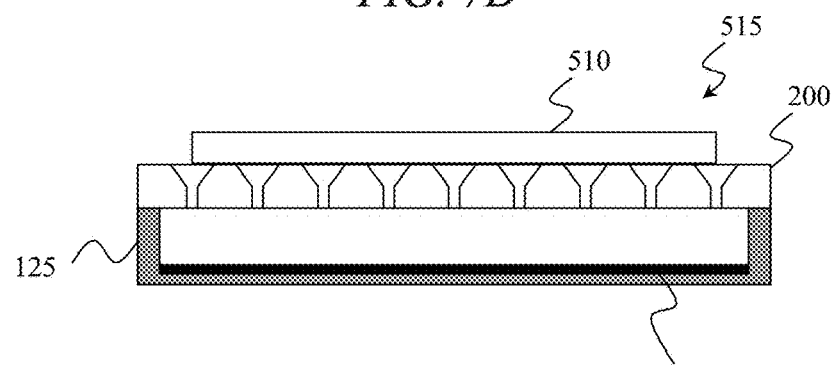

PHASE 7: The reaction chamber 100 is kept at the temperature just reached, while the precursor flow (silicon and carbon) is kept constant with respect to the preceding phases. In this way, while the 3C SiC layer 510 continues to grow in thickness, since supplied by the precursors flow of the silicon and of the carbon, the underneath silicon substrate 102 starts to melt, and in the melted state passes through the draining openings of the susceptor 200, for being collected in the underneath gathering tank 125. With the melting, and the passage in the underneath gathering tank 125, of an ever increasing portion of the substrate 102, the warping affecting the wafer tends to diminish, being the wafer made up more and more by silicon carbide and less and less by silicon. The duration of this phase is set in such a way to allow the melting and the separation of (substantially) all the silicon of the substrate 102. In this situation, illustrated in FIG. 7C, the resulting semiconductor material wafer located on the susceptor 200—globally identified in the figure with the reference 515—results from being formed by the 3C SiC layer 510; the silicon collected by the gathering tank 125 after the melting of the substrate 102 is identified in the figure with the reference 520. With the reticular discontinuity at the interface Si—SiC no longer being present, the SiC layer 515 becomes planar. Growing a 3C SiC layer 510 of sufficiently high thickness (30-40 microns, see PHASE 5) before raising the temperature above the melting point of the silicon is advantageous, since said SiC layer should be capable of remaining integral even without the underneath silicon substrate 102. With a 3C SiC 510 layer being thin, the wafer 515 would risk breakage due to the silicon melting.

PHASE 8: Continuing to supply the reaction chamber with the precursor flow, the thickness of the 3C SiC layer 510 (and, thus, of the SiC layer 515) continues to grow. When the thickness has reached a sufficiently high level (for example about 100 microns), the temperature of the reaction chamber 100 is brought again to a value lower than the melting temperature of the silicon, for example at about 1370° C. In this way, the melted silicon 520 collected in the gathering tank 125 firms up.

Figure 7D:
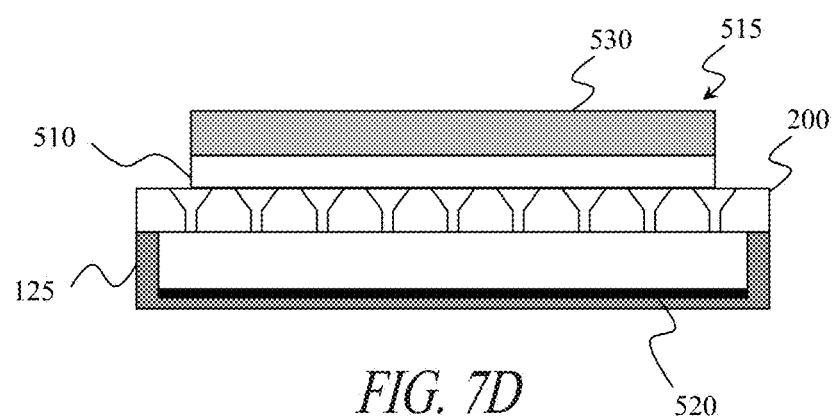

PHASE 9: Keeping the reaction chamber 100 at the temperature reached in PHASE 8, and continuing to constantly provide the flow of silicon and carbon precursors, a further layer of 3C SiC, identified in FIG. 7D with the reference 530, is grown on the layer 510 of SiC, having desired thickness and resistivity. Unlike the preceding phases, wherein the growing was of the heteroepitaxial type—indeed, other than the SiC layer 510 the silicon substrate 102 was present—, the growing of the layer 530 results to be of the homoepitaxial type, since the wafer 515 results to be exclusively formed by SiC. During this phase, it is further possible to input in the chamber—together with the silicon and carbon precursors—doping elements for varying the resistivity of the layer 530. The portion of the wafer 515 corresponding to the layer 530 may be thus used as an active zone wherein forming the electronic devices. For example, for dopings of the N type it is possible to add nitrogen, while for dopings of the P type it is possible to add aluminium, for example in form of an organometallic compounds (trimethylaluminium).

PHASE 10: Having reached the desired thickness of the SiC layer, the temperature of the reaction chamber 100 is taken back to the room temperature, and the precursors flow is interrupted.

At the end of the last phase of the method according to the disclosure, a wafer 515 of 3C SiC is obtained as final product, having the desired thickness and resistivity and a good planarity degree, and a mass of polycrystalline silicon as waste product.

According to another embodiment of the present disclosure, the 3C SiC wafer fabrication method above described may be optimised using a reaction chamber with a mobile gathering tank, adapted to pass in particular phases of the growing process from a first configuration, wherein the tank is in contact with the susceptor and forms therewith a single body, to a second configuration, wherein the tank and the susceptor are separated, and vice versa.

Figure 8A:
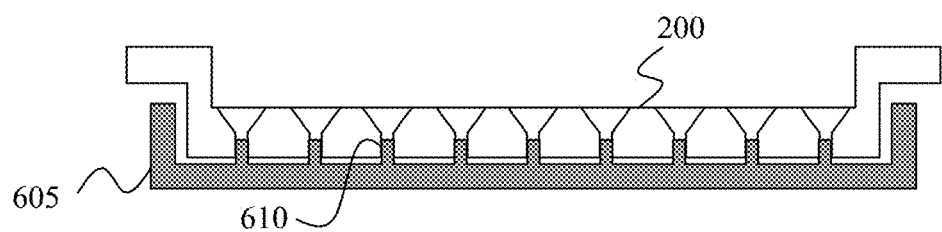
FIG. 8A and FIG. 8B are sectional view of a mobile gathering tank according to an embodiment of the present disclosure.
Figure 8B:
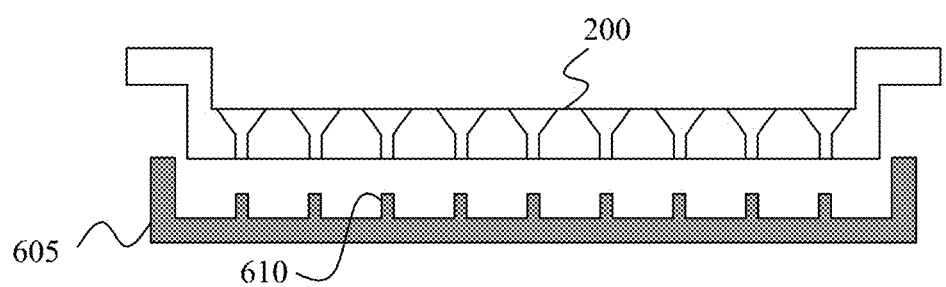

FIG. 8A is a sectional view of a mobile gathering tank according to an embodiment of the present disclosure, identified with the reference 605, in the first configuration, while FIG. 8B is a sectional view of the same mobile gathering tank 605 in the second configuration. According to an embodiment of the present disclosure, the mobile gathering tank 605 comprises a plurality of protruding elements 610 that protrude from the bottom of the tank itself; each protruding element 610 is adapted to engage a respective draining opening of the susceptor 200 when the mobile gathering tank 605 is in the first configuration. As visible in FIG. 8A, when the mobile gathering tank 605 is in the first configuration, the draining openings of the susceptor 200 are closed; in this configuration, the gathering of melted material in the tank is prevented, allowing, in some phases of the wafer manufacturing method, the coexistence of the 3C SiC solid mass in contact with the liquid mass of the melted Si. The mobile gathering tank 605 is configured to be moved perpendicularly to the susceptor surface 200 in such a way to disengage the protruding elements 610 from the respective draining openings of the susceptor 200. In this configuration, visible in FIG. 8B, the draining openings of the susceptor are open, allowing thus the gathering of melted material in the tank.

As already mentioned, the mobile gathering tank 605 may be advantageously employed for optimising the method previously described. Such optimisation provides for performing the previously described method until the phase wherein the temperature is risen above the silicon melting temperature (PHASE 6) with the mobile gathering tank 605 kept in the first configuration (draining openings closed). Since the draining openings of the susceptors 200 are closed, the melted Si which is produced because of the high temperature cannot flow out. The mobile gathering tank 605 is kept in the first configuration during all the SiC deposition phase; in this way, a more uniform heat distribution occurs between the wafer and the susceptor, and the solid mass of SiC is in contact with the melted mass of Si during the whole SiC deposition phase. Once the desired SiC thickness is reached, always keeping the temperature of the reaction chamber at the temperature reached in the previous phase, the mobile gathering tank 605 is lowered and brought in the second configuration, in such a way to free the draining openings of the susceptor 200; at the same time, the reaction chamber is brought back to the room temperature. In this way, the melted silicon flows in the mobile gathering tank 605 passing through the draining openings. Unlike the preceding case (fixed gathering tank), wherein the separation between Si and SiC was only caused by the rising of the chamber temperature above the melting temperature, in this case the separation is further favoured by the dragging mechanical action of the melted silicon toward the bottom caused by the lowering of the mobile gathering tank 605.

Figure 9A:
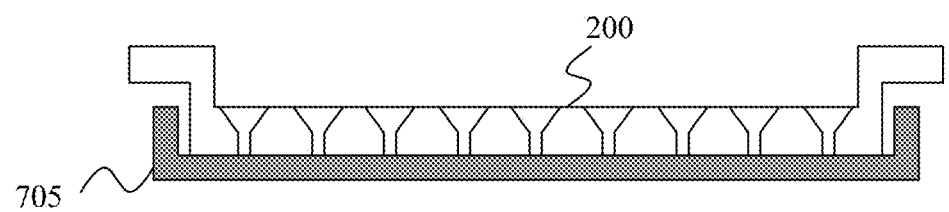
FIG. 9A and FIG. 9B are sectional view of a mobile gathering tank according to a further embodiment of the present disclosure.
Figure 9B:
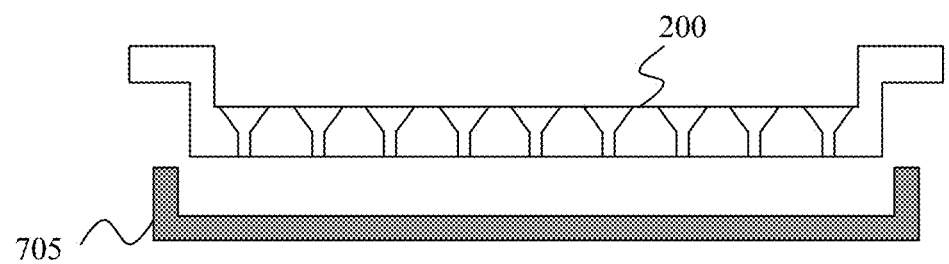

FIG. 9A and FIG. 9B show a mobile gathering tank 705 according to a further embodiment of the present disclosure, wherein the mobile gathering tank 705 has the bottom voids of protruding elements. FIG. 9A is a sectional view of the mobile gathering tank 705 in the first configuration, while FIG. 9B is a sectional view of the mobile gathering tank 705 in the second configuration. Even according to such embodiment, in the first configuration the draining openings of the susceptors 200 results to be closed, preventing the gathering of melted material in the tank, while in the second configuration the draining openings of the susceptors results to be open, allowing the gathering of melted material in the tank.

The mobile gathering tank 705 may be employed in the same way as the mobile gathering tank 605.

Figure 10A:
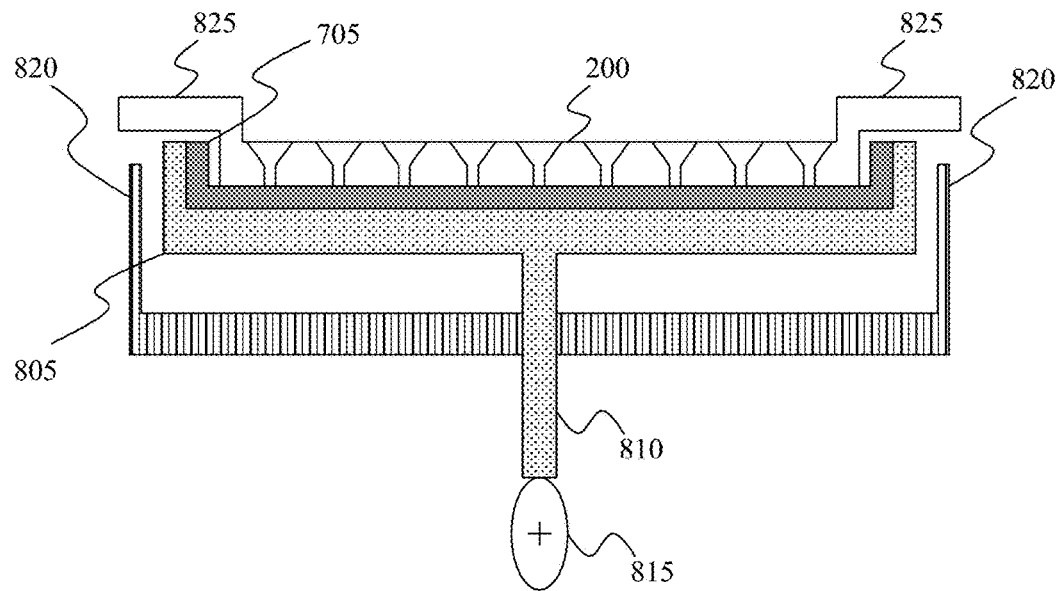
FIG. 10A and FIG. 10B are sectional view of a moving device of the gathering tank of FIGS. 9A and 9B according to an embodiment of the present disclosure.
Figure 10B:
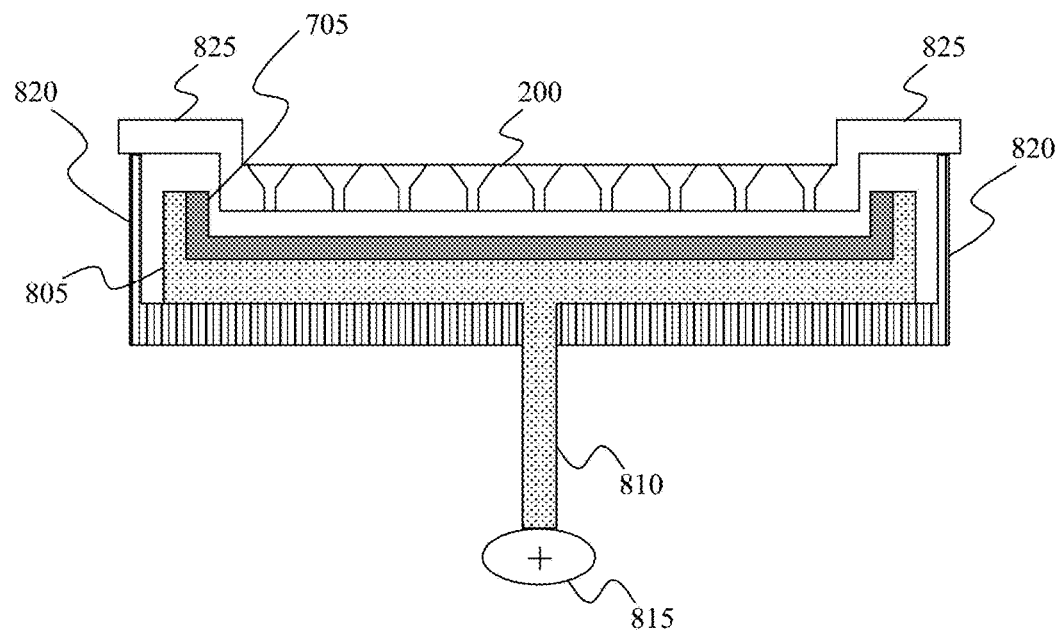

A possible implementation of a moving device adapted to vertically move a mobile gathering tank according to the present disclosure (for example, the mobile gathering tank 705 voids of protruding elements) is illustrated in FIGS. 10A and 10B. FIG. 10A is a sectional view of the bundle susceptor-tank-moving device when the mobile gathering tank 705 is in the first configuration, while FIG. 10B is a sectional view of the bundle susceptor-tank-moving device when the mobile gathering tank 705 is in the second configuration. According to an embodiment of the present disclosure, the moving device comprises a container element (for example implemented in CalCarb® material) 805 adapted to accommodate the mobile gathering tank 705; the container element 805 is connected to a vertical support element 810 adapted to be translated (together with the container element 805 and the mobile gathering tank 705 housed therein) along a direction perpendicular to the susceptor 200 surface by mechanical moving devices, such as a cam element 815. According to an embodiment of the present disclosure, suspension elements 820 are provided for keeping the susceptor 200 in a position which is separated from the mobile gathering tank 705 when the latter is in the second configuration. According to an embodiment of the present disclosure, the suspension elements 820 are vertical elements configured to mechanical engage a corresponding protruding lateral support element 825 provided on a corresponding lateral side of the susceptor 200. When the mobile gathering tank 705 is in the first configuration, the susceptor 200 is supported by the bottom of the mobile gathering tank 705, with the protruding elements 825 which are disengaged from the suspension elements 820, since the formers are located in a position higher than the latter. In order to pass to the second configuration, the cam element 815 is rotated, in such a way that the vertical support element 810 and the container element 805 translate toward the bottom. By translating, the container element 805 brings therewith (toward the bottom) the mobile gathering tank 705 and the susceptor 200 as well. During the translation toward the bottom of the container element 805, at a certain point the lateral support elements 825 engage the corresponding suspension elements 820. Consequently, while the mobile tank 705 proceeds in the descent together with the container element 805, the susceptor 200 separates therefrom, remaining bound to the suspension elements 820 in a suspended position.

Although in the present description it has been largely discussed a method for producing 3C SiC wafers starting from a Si substrate, the concepts of the present disclosure (included the use of susceptors provided with draining openings and/or the use of mobile gathering tanks) may be applied to all those heteroepitaxiable semiconductor materials having a melting temperature higher than that of the material forming the substrate (for example, different from Si).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
positioning a crystalline substrate on a susceptor, the susceptor having a plurality of draining openings;
moving a gathering tank to a first position, the gathering tank including a plurality of protruding elements, the plurality of protruding elements extending in to the plurality of draining openings when the gathering tank is in the first position;
forming a first layer of a first material on the crystalline substrate by exposing the crystalline substrate to a flow of first material precursors, the first material having a first melting temperature, the crystalline substrate being of a second material having a second melting temperature that is lower than the first melting temperature;
melting the second material of the crystalline substrate using a first process temperature that is higher than the second melting temperature and lower than the first melting temperature;
forming a second layer of the first material on the first layer by exposing the first layer to the flow of first material precursors; and
moving the gathering tank to a second position, the gathering tank being spaced from the susceptor when the gathering tank is in the second position.

2. The method according to claim 1, wherein forming the first layer and the second layer of the first material are carried out at a second process temperature that is lower than the second melting temperature.

3. The method according to claim 1, wherein the first material is 3C polytype silicon carbide and the second material is crystalline silicon.

4. The method according to claim 2, further comprising activating a surface of the crystalline substrate before exposing the crystalline substrate to the flow of first material precursors for forming the first layer, the activating being carried out at a third process temperature that is lower than the second process temperature.

5. The method according to claim 1, wherein:
forming the first layer includes heteroepitaxially growing the first layer on the crystalline substrate, and
forming the second layer includes homoepitaxially growing the second layer on the first layer.

6. A method, comprising:
positioning a substrate of a first material on a susceptor having a plurality of draining openings;
moving a receptacle to a first position, the receptacle including a plurality of protruding elements, the plurality of protruding elements extending in to the plurality of draining openings when the receptacle is in the first position;
epitaxially growing a first layer of a second material on a surface of the substrate;
melting the substrate from the first layer;
epitaxially growing a second layer of the second material on the first layer; and
moving the receptacle to a second position, the receptacle being spaced from the susceptor when the receptacle is in the second position.

7. The method of claim 6, wherein the first material is crystalline silicon and the second material is 3C polytype silicon carbide.

8. The method of claim 6, wherein the susceptor is positioned in a chamber, and melting the substrate from the first layer includes heating the chamber to a first temperature that is between a melting temperature of the first material and a melting temperature of the second material.

9. The method of claim 6, further comprising cooling the chamber to a temperature that is lower than a melting temperature of the first material after the substrate is melted from the first layer.

10. The method of claim 6, further comprising exposing the substrate to hydrogen flow before epitaxially growing the first layer at a first temperature.

11. The method of claim 10, further comprising adding a carbon precursor to the hydrogen flow at a second temperature that is larger than the first temperature.

12. A method, comprising:
positioning a substrate on a first platform, the first platform including lateral supports, a center portion, and a plurality of apertures in the center portion, the first platform overlying a second platform, the second platform including sidewalls;
positioning a receptacle in a first position, the receptacle abutting the center portion of the first platform when the receptacle is in the first position;
forming a first layer of a first material on the substrate;
melting the substrate while the first layer is being formed on the substrate;
forming a second layer of the first material on the first layer; and
positioning the receptacle in a second position, the receptacle being spaced from the center portion of the first platform and the lateral supports of the first platform resting on the sidewalls of the second platform when the receptacle is in the second position.

13. The method of claim 12, wherein melting the substrate includes heating the first layer and the substrate to a temperature that is lower than a melting temperature of the first material and higher than a melting temperature of the substrate.

14. The method of claim 12, further comprising cooling the melted substrate to a temperature that is lower than a melting temperature of the substrate.

15. The method according to claim 12, wherein the first material is 3C polytype silicon carbide and the substrate is made of crystalline silicon.

16. The method of claim 12, further comprising exposing the substrate to hydrogen flow before forming the first layer on the substrate.

17. The method of claim 16, further comprising adding a carbon precursor to the hydrogen flow before forming the first layer on the substrate.

* * * * *